(12) United States Patent
Liu et al.

(10) Patent No.: US 12,501,646 B2
(45) Date of Patent: Dec. 16, 2025

(54) PI-TYPE TRENCH GATE SILICON CARBIDE MOSFET DEVICE AND FABRICATION METHOD THEREOF

(71) Applicant: JSAB TECHNOLOGIES (SHENZHEN) LTD., Shenzhen (CN)

(72) Inventors: Yong Liu, Shenzhen (CN); Hao Feng, Shenzhen (CN); Xin Peng, Shenzhen (CN); Johnny Kin On Sin, Shenzhen (CN)

(73) Assignee: JSAB TECHNOLOGIES (SHENZHEN) LTD., Shenzhen (CN)

( * ) Notice: Subject to any disclaimer, the term of this patent is extended or adjusted under 35 U.S.C. 154(b) by 0 days.

(21) Appl. No.: 18/950,687

(22) Filed: Nov. 18, 2024

(65) Prior Publication Data

US 2025/0176207 A1    May 29, 2025

(30) Foreign Application Priority Data

Nov. 24, 2023   (CN) .......................... 202311577452.1

(51) Int. Cl.
  *H10D 30/60*    (2025.01)
  *H01L 21/265*   (2006.01)
  (Continued)

(52) U.S. Cl.
  CPC ..... *H10D 30/611* (2025.01); *H01L 21/26513* (2013.01); *H01L 21/28176* (2013.01);
  (Continued)

(58) Field of Classification Search
  CPC ............ H10D 30/0297; H10D 30/668; H10D 62/105; H10D 62/107; H10D 62/127; H10D 62/393; H10D 64/01; H10D 64/513
  (Continued)

(56) References Cited

U.S. PATENT DOCUMENTS

| | | |
|---|---|---|
| 2014/0042523 A1 | 2/2014 | Yamagami et al. |
| 2019/0035903 A1 | 1/2019 | Yan |
| 2022/0336602 A1* | 10/2022 | Moon ................ H10D 62/8325 |

FOREIGN PATENT DOCUMENTS

| | | |
|---|---|---|
| CN | 102456738 A | 5/2012 |
| CN | 104282750 A | 1/2015 |

(Continued)

*Primary Examiner* — Fazli Erdem
(74) *Attorney, Agent, or Firm* — MUNCY, GEISSLER, OLDS & LOWE, P.C.

(57) ABSTRACT

The disclosure relates to a π type trench gate silicon carbide MOSFET device and a fabrication method thereof. To protect a trench gate oxide layer without increasing a channel resistance and process complexity, a second conductivity type of heavily doped deep well inserted with double gate trenches along the sidewalls of deep well is designed. The deep well is connected to the source metal directly. The electric potential is clamped to the source during the voltage blocking and turn-off state, which reduces the electric field in the gate oxide and reduces the miller capacitance. An interlayer dielectric layer is deposited above the conductive dielectric polysilicon layers and extends outward separately to cover a part of the source region. A smaller cell pitch can be achieved by controlling the spacing between the first and the second trench gate, thereby increasing the channel density and reducing the channel resistance.

3 Claims, 8 Drawing Sheets

(51) Int. Cl.
   *H01L 21/28* (2025.01)
   *H01L 21/306* (2006.01)
   *H10D 12/01* (2025.01)
   *H10D 30/01* (2025.01)
   *H10D 30/63* (2025.01)
   *H10D 62/10* (2025.01)
   *H10D 62/832* (2025.01)
   *H10D 64/27* (2025.01)

(52) U.S. Cl.
   CPC ..... *H01L 21/30604* (2013.01); *H10D 12/031* (2025.01); *H10D 30/025* (2025.01); *H10D 30/63* (2025.01); *H10D 62/10* (2025.01); *H10D 62/124* (2025.01); *H10D 62/8325* (2025.01); *H10D 64/513* (2025.01)

(58) Field of Classification Search
   USPC ........................................................... 257/77
   See application file for complete search history.

(56) References Cited

FOREIGN PATENT DOCUMENTS

| | | | |
|---|---|---|---|
| CN | 107275406 A | | 10/2017 |
| CN | 111403486 A | | 7/2020 |
| CN | 114203821 A | | 3/2022 |
| CN | 115410921 A | | 11/2022 |
| CN | 115708223 A | * | 2/2023 |
| CN | 117080269 A | | 11/2023 |
| WO | WO-2014/178262 A1 | | 11/2014 |

* cited by examiner

PI-TYPE TRENCH GATE SILICON CARBIDE MOSFET DEVICE AND FABRICATION METHOD THEREOF

FIELD OF TECHNOLOGY

The present disclosure relates to power semiconductor devices, in particular to a trench gate silicon carbide metal oxide semiconductor field effect transistor (MOSFET) device and a fabrication method thereof.

BACKGROUND

Silicon carbide is a third-generation power semiconductor material with several advantages over conventional silicon materials, including a high critical electric field, high carrier saturation velocity, and good heat dissipation. These properties make it more suitable for the fabrication of high-performance power MOSFET devices. The power loss of a silicon carbide MOSFET includes a conduction loss and a switching loss, where the conduction loss mainly includes a loss caused by a channel resistor, an epitaxial layer resistor, a substrate resistor, and a metal contact resistor. For the silicon carbide MOSFET, due to the presence of a large number of interface states in a gate dielectric layer, the carrier mobility is severely reduced by Coulomb scattering caused by the interface states, resulting in a high proportion of the channel resistance in the total resistance of the MOSFET (BV≤1,700 V). One approach to reduce the channel resistance is to increase the channel density. A trench gate silicon carbide MOSFET can eliminate the JFET effect present in a planar gate structure and reduce the cell pitch to achieve higher channel density. Increasing the channel density is equivalent to connect more channel resistors in parallel, thereby reducing the total channel resistance. Accordingly, the higher current conduction capacity is achieved under the same chip area.

However, during voltage blocking state of the trench gate silicon carbide MOSFET, due to the curvature effect, there is high electric field strength (>4 MV/cm) at the bottom corner of a trench, which can lead to low breakdown voltage and reliability issues. Therefore, it is very important to reduce the electric field at the bottom corner of the trench gate, and protect the gate dielectric layer from degradation under the high electric field for the trench gate silicon carbide MOSFET.

One solution to reduce the electric field at the bottom of the trench gate in the prior art is to introduce a P+ buried layer 107 at the bottom of the trench gate, as shown in FIG. 1. To effectively protect a gate oxide layer at the bottom of the trench gate, the P+ buried layer 107 needs to be connected to a ground potential in the voltage blocking state. A grounding solution involves using a square cell design, with a dummy cell trench designed at intervals of several cells, as shown in FIG. 2. By etching a source contact hole to a P+ buried layer 113 at the bottom of a dummy cell trench gate, a source metal 112 forms ohmic contact with the P+ buried layer 113, thereby connecting the P+ buried layer 113 of the dummy cell to a source potential. The P+ buried layer 113 of the dummy cell intersects with the P+ buried layer 107 at the bottom of active cell through layout design to achieve electrical connection. During voltage blocking of the device, the source metal is grounded, so the potentials of both the P+ buried layer 113 and 107 are zero. However, as the dummy cell does not conduct the current, the more dummy cells there are, the more current conductive channels are sacrificed, and the higher the specific on-resistance of the silicon carbide MOSFET is. Hence, the dummy cells are usually arranged at intervals of several to ten cells. In this case, the P+ buried layer 107 at the bottom of the trench gate of the cell farthest from the dummy cell is connected to the P+ buried layer 113 of the dummy cell through a long distance of P+. Considering low electrical activation rate and high resistivity of the P type silicon carbide, the P+ buried layer 107 at the bottom of the active cell trench is equivalently connected in series with a resistor and then connected to the P+ buried layer 113 of the dummy cell. During turn-off of the silicon carbide MOSFET, displacement current flows through the P+ buried layer 107 along the internally connected P+ buried layer to the contact hole of dummy cell. As the internal resistance of P+ buried layer cannot be negligible, the potential of the P+ buried layer 107 at the bottom of the active cell trench gate is not zero, which leads to high electric field in the gate oxide layer at the corresponding position and reliability issues of the device. Furthermore, the electric potential of the P+ buried layer 107 at the bottom of the active cell trench gate leads to a decrease of dV/dt, and an increase of switching loss.

Another solution for grounding of a P+ buried layer in the prior art involves adding tilted ion implantation 208 on one side of a trench gate to achieve electrical connection between the P+ buried layer 207 and a P well 210, as shown in FIG. 3. However, such solution not only requires an additional ion implantation, but also sacrifices half of conductive channels, resulting in a twice higher of channel resistance.

SUMMARY

In view of the above-mentioned problems of the trench gate silicon carbide MOSFET in the prior art, a novel trench gate silicon carbide MOSFET device and a fabrication method thereof are needed. The proposed solution should protect the gate oxide layer by reducing the electric field strength without increasing the channel resistance and process complexity, and hence improve the reliability of the device. In addition, the Miller capacitance should be reduced to increase the value of dV/dt and reduce the switching loss.

To achieve the above objective, the present disclosure proposes a method for fabricating a π type trench gate silicon carbide MOSFET device.

The method for fabricating a π type trench gate silicon carbide MOSFET device includes the following steps:

Step one: growing a first conductivity type of lightly doped epitaxial layer on a first conductivity type of heavily doped silicon carbide substrate;

Step two: forming a second conductivity type of heavily doped deep well region on an upper surface of the first conductivity type of lightly doped epitaxial layer by means of high-energy ion implantation;

Step three: forming a second conductivity type of well region, a second conductivity type of heavily doped contact region, and a first conductivity type of heavily doped source region on the upper surface of the epitaxial layer by means of selective ion implantation, and performing high-temperature annealing to activate impurities, where before the annealing process, a carbon cap needs to be used to cover the surface of silicon carbide to prevent out-diffusion of the impurities and migration of silicon carbide atoms on the surface;

Step four: etching a first trench and a second trench spaced from each other along the right and left sidewalls of the second conductivity type of heavily doped deep well region by means of dry etching;

Step five: growing a gate oxide layer by means of dry oxidation, and performing oxide layer annealing;

Step six: depositing conductive dielectric layers, performing photolithography and etching;

Step seven: depositing interlayer dielectric layer, performing photolithography and etching;

Step eight: depositing an ohmic contact metal on the front surface, selectively removing the metal outside a contact hole, performing ohmic contact metal annealing, depositing a thick metal on the front surface, performing photolithography and etching, then depositing a passivation layer, performing photolithography and etching, and performing backside grinding, backside metal deposition and annealing.

A doping impurity in the step one is nitrogen.

In the second step, an implanted ion is aluminum, and an implantation temperature is 500° C.

In the third step, an annealing temperature is 1600-1800° C., and the carbon cap is used to cover the surface of the silicon carbide before the annealing process.

In the sixth step, deposition materials of the conductive dielectric layers are polysilicon layers or other metal silicide materials.

As a preference, in the step four, the first trench and the second trench are etched along the right and left sidewalls of the second conductivity type of heavily doped deep well region with trench depth of shallower than the junction depth of the second conductivity type of heavily doped deep well region.

The outer sidewalls of both the first and the second trench gates are not in the second conductivity type of heavily doped deep well region. The outer sidewalls are in contact with the first conductivity type of heavily doped source region, the second conductivity type of well region, and the first conductivity type of lightly doped epitaxial layer from top to bottom.

As a preference, the interlayer dielectric layers are deposited above the conductive dielectric polysilicon layers and extend outwards separately to cover a part of the first conductivity type of heavily doped source region.

As a preference, in the step three, a first conductivity type of current spreading layer is formed by means of selective ion implantation, where the doping concentration of the first conductivity type of current spreading layer is higher than the doping concentration of the first conductivity type of lightly doped epitaxial layer and lower than the doping concentration of the second conductivity type of heavily doped deep well region.

A second objective of the present disclosure is to provide a π type trench gate silicon carbide MOSFET device, fabricated with the method provided by the present disclosure.

The work mechanism of the present disclosure is explained as follows:

According to the present disclosure, the second conductivity type of heavily doped deep well region (a P+ deep well 307) is fabricated by means of high-energy ion implantation. The second conductivity type of heavily doped deep well region (the P+ deep well 307) is deeper than the trench gates (304 and 313). The trench gates are located inside the second conductivity type of heavily doped deep well region (the P+ deep well 307), except that the right sidewall of the first trench 304 and the left sidewall of the second trench 313 overlap with the side boundary of the second conductivity type of heavily doped deep well region (the P+ deep well 307). The spacing between the first trench gate 304 and the second trench gate 313 can be adjusted based on the process capability to ensure the etching of the contact hole and the metal filling without void. After filling of a source metal 312, the second conductivity type of heavily doped deep well region (the P+ deep well 307) can remain the same electric potential as the source metal. The second conductivity type of heavily doped deep well region (the P+ deep well 307) is directly connected to the source metal. It is different from the prior technical solution as shown in FIG. 1, where a P+ buried layer needs to be connected to the source through a long distance of P+ buried layer. The electric potential of the second conductivity type of heavily doped deep well region (the P+ deep well 307) is maintained at zero during the voltage blocking state. Thus, the gate oxide can effectively be screened from high electric field, and the reliability is improved. During the switching of the device, as the electric potential of the second conductivity type of heavily doped deep well region (the P+ deep well 307) remains the same as that of the source metal, the Miller capacitance of the MOSFET keeps low, which increases the value of dV/dt and reduces the switching loss.

Compared with the existed technical solution as shown in FIG. 3, the present disclosure achieves smaller cell pitch by controlling the spacing between the first trench gate and the second trench gate, thereby increasing the channel density and reducing the channel resistance. Meanwhile, tilted ion implantation is not required, which lowers the process complexity.

DETAILED DESCRIPTION OF THE EMBODIMENTS

It needs to be noted that the device structure herein is not limited to the metal oxide semiconductor field effect transistor (MOSFET), and other unipolar or bipolar device structures are also applicable. Likewise, the semiconductor material herein is not limited to the silicon carbide material, and other silicon, germanium, and gallium nitride materials are also applicable. The corresponding positional words such as "up", "down", "left", and "right" described herein correspond to the relative positions with reference to the drawings, and are not limited to fixed directions in specific embodiments. The gate dielectric layer described herein is not limited to silicon dioxide and may be silicon nitride or hafnium dioxide layer. Likewise, the conductive dielectric material is not limited to doped polysilicon and may be other metal silicide film.

Embodiment 1

Figure 4:
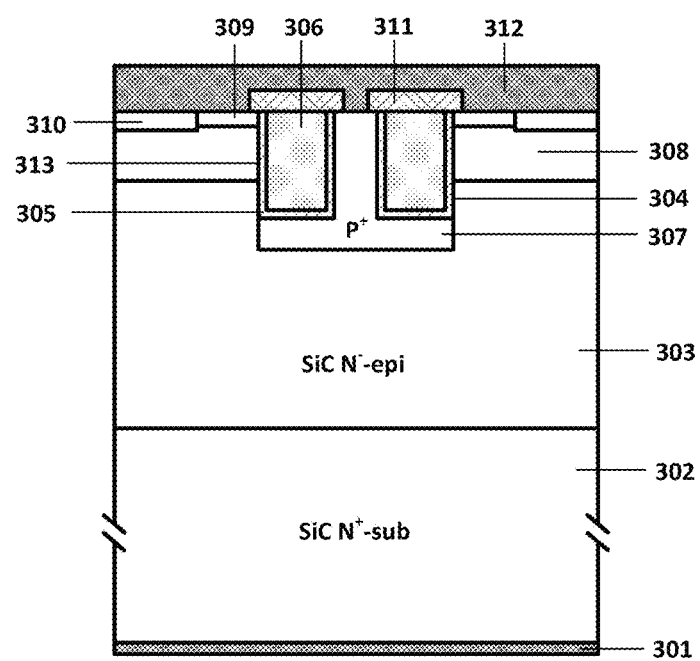
FIG. 4 is a schematic cross-sectional structural diagram of a π type trench gate silicon carbide MOSFET device according to the first embodiment of the present disclosure.

FIG. 4 is a schematic cross-sectional view of a π type trench gate silicon carbide MOSFET device according to the first embodiment of the present disclosure. The device structure includes a drain electrode 301 at a bottom, a heavily doped silicon carbide N+ substrate 302 (including a buffer layer) on the drain electrode 301. A silicon carbide N-epitaxial layer 303 is located on the heavily doped silicon carbide N+ substrate 302 (including the buffer layer). On the surface of the epitaxial layer 303, there are first trench gate 304 and second trench gate 313. Gate trench pairs consist of the first trench gate 304, second trench gate 313 and a P+ deep well 307, which are arranged periodically. The distance between the first trench gate 304 and the second trench gate 313 is not larger than the width of mesa between two adjacent gate trench pairs. The trench gate includes a gate dielectric layer 305 and a conductive dielectric polysilicon layer 306. The right sidewall of the first trench gate 304 and the left sidewall of the second trench gate 313 are adjacent to the P type well region 308 and N-epitaxial layer 303. The bottom and left sidewall of the first trench gate 304 and the bottom and right sidewall of the second trench gate 313 locate in the P+ deep well 307. An N+ source region 309 is at the upper surface of P type well region 308 and adjacent to the gate trench. A P+ contact region 310 is at the upper surface of P type well region 308 and adjacent to the N+ source region 309. Interlayer dielectric layers 311 are located above the first trench gate 304 and the second trench gate 313, and cover a part of the N+ source region 309. A source metal 312 short-circuits the P+ contact regions 310, the N+ source regions 309, and the P+ deep well layers 307. The interlayer dielectric layers 311 isolate the source metal 312 from the gate electrode.

Figure 5:
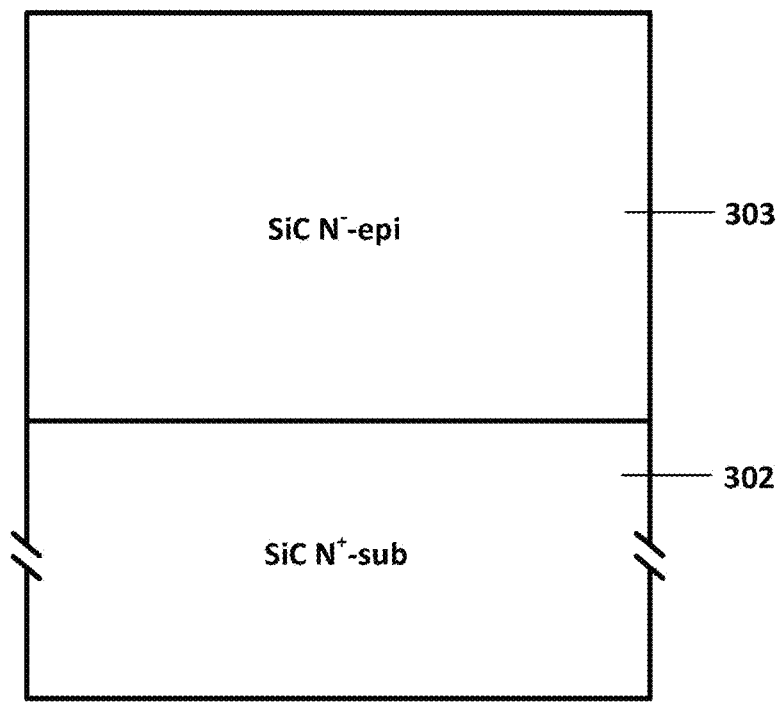
FIGS. 5 to 12 are schematic cross-sectional views of main fabrication steps according to the first embodiment of the present disclosure.
Figure 6:
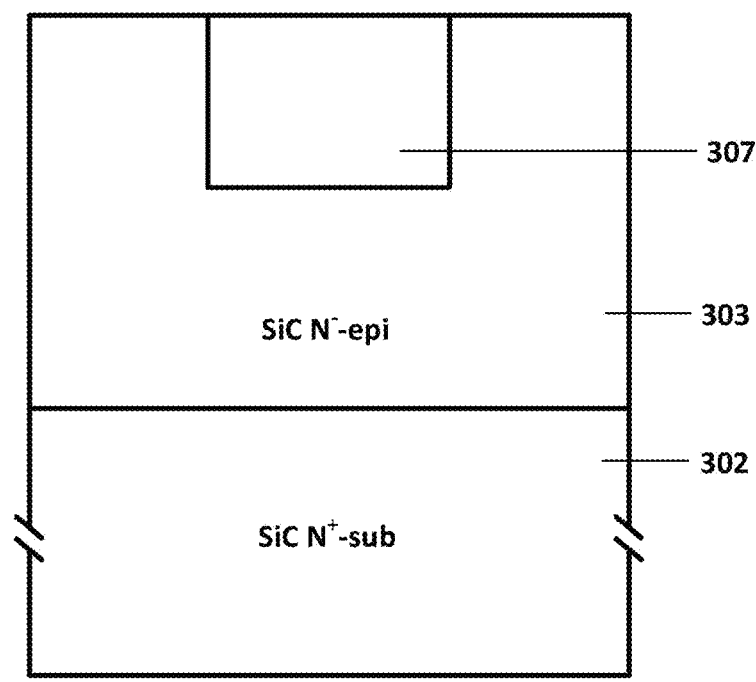
Figure 7:
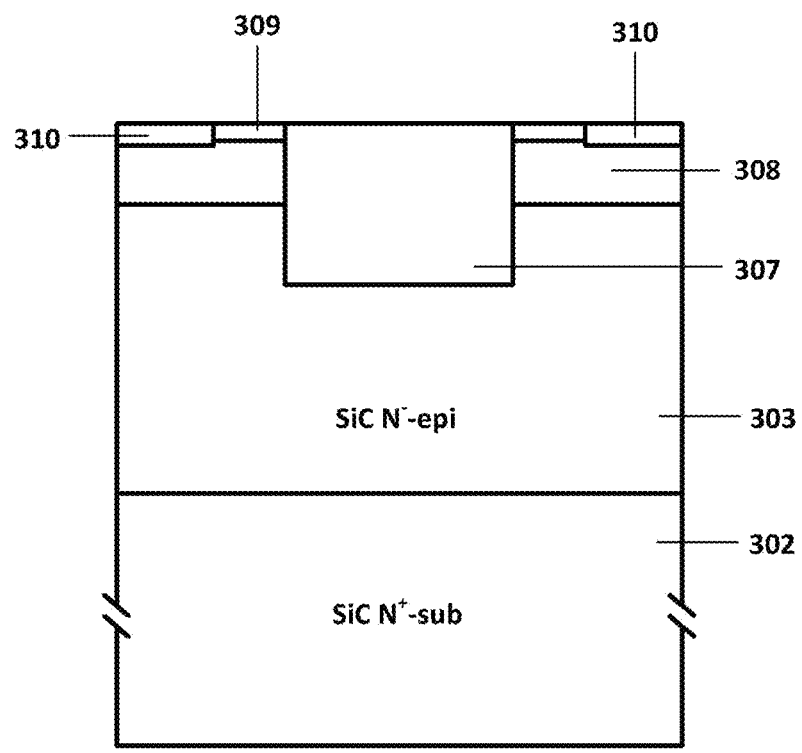
Figure 8:
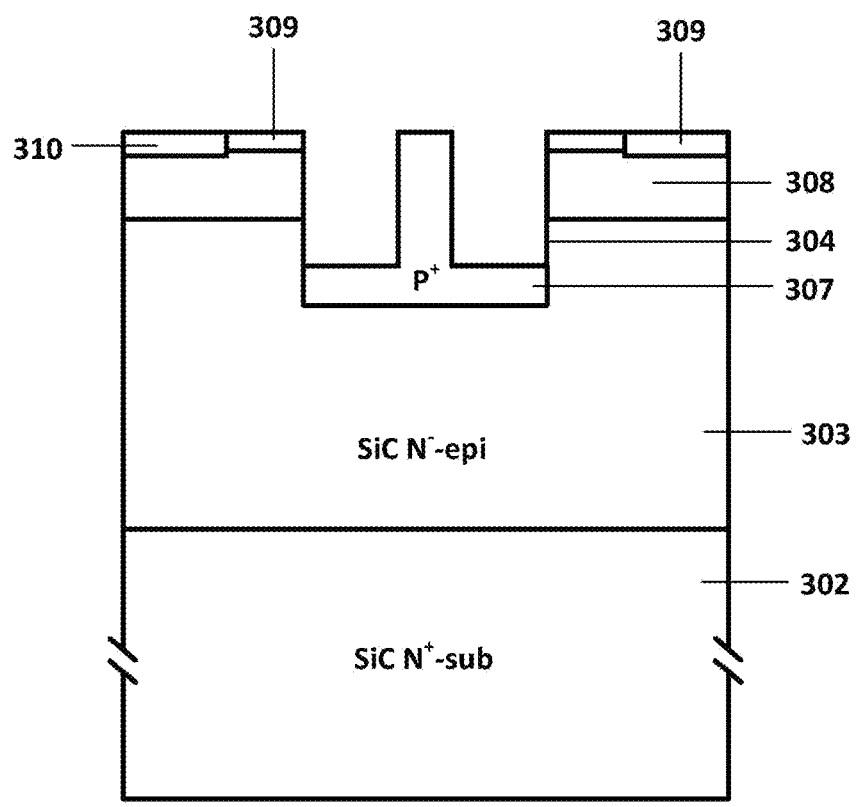

In addition, the present disclosure further provides a method for fabricating the device according to the first embodiment, as shown in FIGS. 5 to 12. Fabrication steps include:

Firstly, an N-epitaxial layer 303 is grown on a heavily doped silicon carbide N+ substrate 302 (including a buffer layer), where a common doping impurity is nitrogen, as shown in FIG. 5;

Secondly, a P+ deep well layer is formed on the upper surface of the N-epitaxial layer 303 by means of high-energy ion implantation, where a common implanted ion for the P+ deep well layer 307 is aluminum, and a common implantation temperature is 500° C., as shown in FIG. 6;

Thirdly, a P well region, a P+ contact region, and a heavily doped N+ source region are implemented at the upper surface of the epitaxial layer by means of selective ion implantation. Then, high-temperature annealing is applied to activate the impurities, where a common annealing temperature is 1600-1800° C. Before the annealing process, a carbon cap needs to be sputtered to cover the surface of silicon carbide to prevent the out-diffusion of the impurities and migration of silicon carbide atoms on the surface, as shown in FIG. 7;

In this step, a first conductivity type of current spreading layer can be chosen to be added. It can be formed by selective ion implantation, wherein the doping concentration of the current spreading layer is higher than that of N-epitaxial layer 303 and lower than that of the second conductivity type of P+ deep well layer 307;

Fourthly, a first trench and a second trench are formed in the P+ deep well region by means of dry etching, as shown in FIG. 8. The right sidewall of the first trench gate 304 and the left sidewall of the second trench gate 313 are adjacent to the P type well region 308 and N-epitaxial layer 303. The bottom and left sidewall of the first trench gate 304 and the bottom and right sidewall of the second trench gate 313 locate in the P+ deep well 307.

Figure 9:
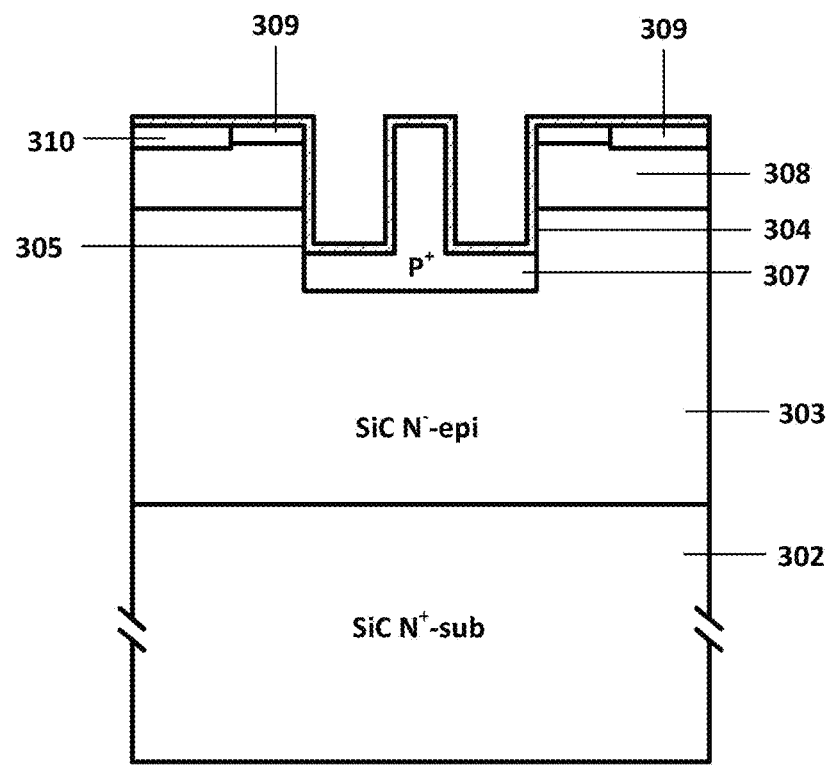
Figure 10:
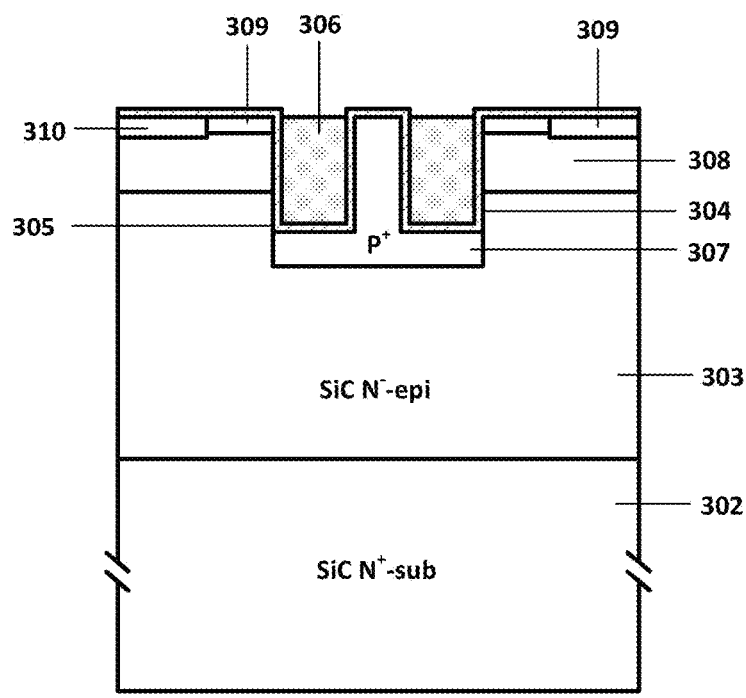
Figure 11:
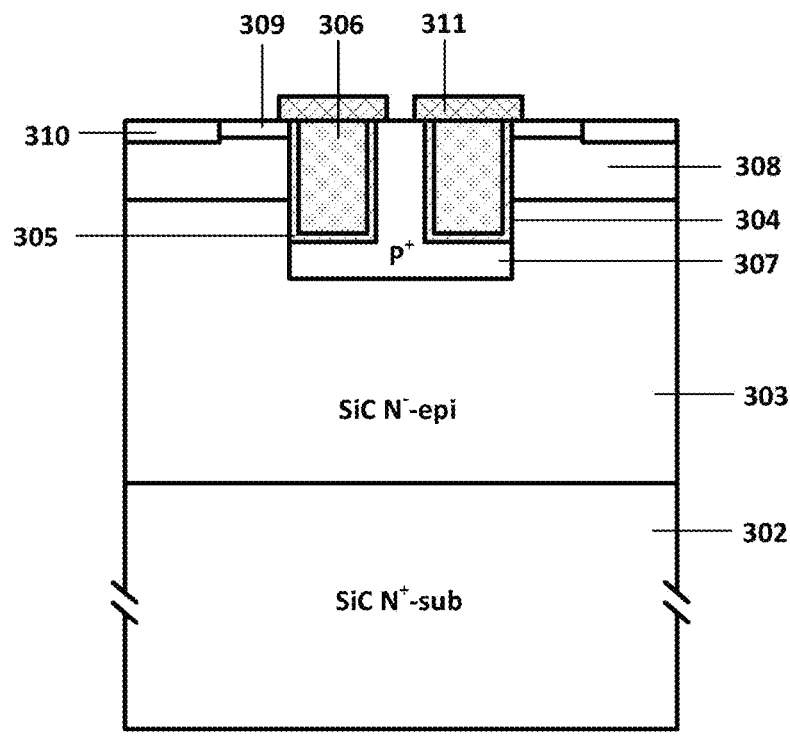
Figure 12:
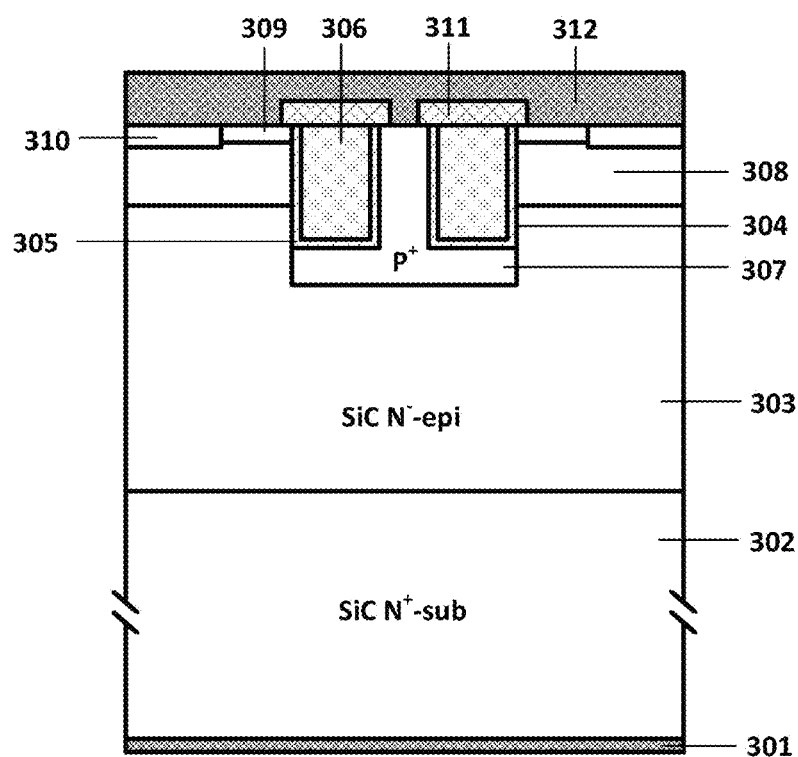
Figure 13:
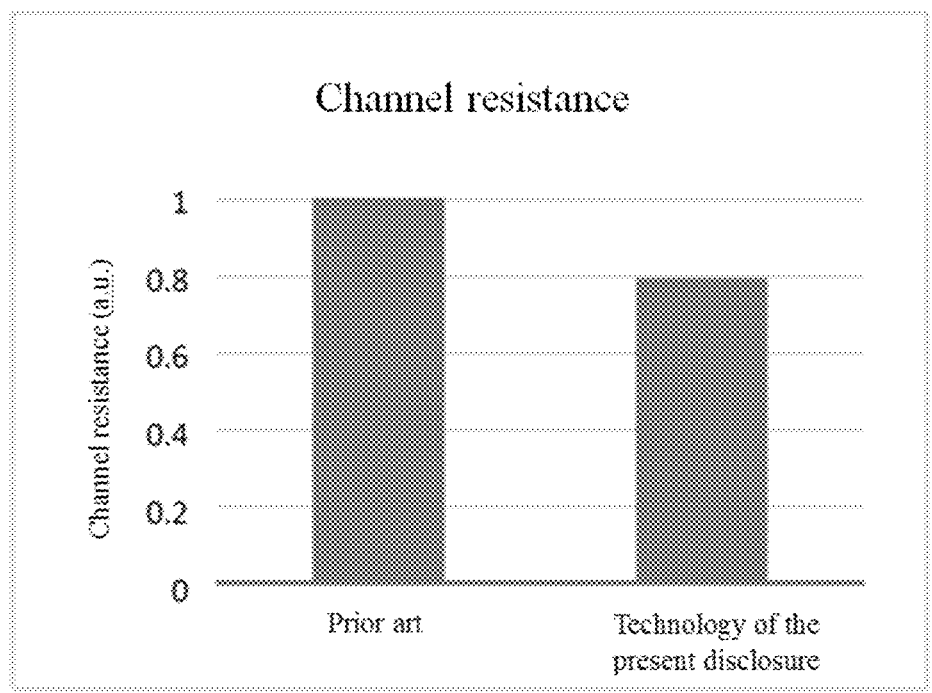
FIG. 13 is a comparison of a channel resistance between a π type trench gate silicon carbide MOSFET device according to the first embodiment of the present disclosure and a MOSFET with tilted implantation on trench sidewalls in the prior art.

Fifthly, a gate oxide layer is grown by means of dry oxidation followed by a post-oxide annealing process, as shown in FIG. 9;

Sixthly, conductive dielectric of polysilicon layers are deposited followed by photolithography and etching, as shown in FIG. 10;

Seventhly, interlayer dielectric layers are deposited. Then, photolithography and etching are done to pattern the interlayer dielectric, as shown in FIG. 11;

Finally, an ohmic contact metal is sputtered on the front surface. The metal outside the contact hole is selectively removed followed by metal annealing. After that, a thick metal (such as aluminum), is sputtered and patterned by photolithography and etching. A passivation layer is formed on the front-side metal and pad is opened before the wafer thinning by grinding. Then, backside metal is sputtered and annealed, as shown in FIG. 12.

Figure 1:
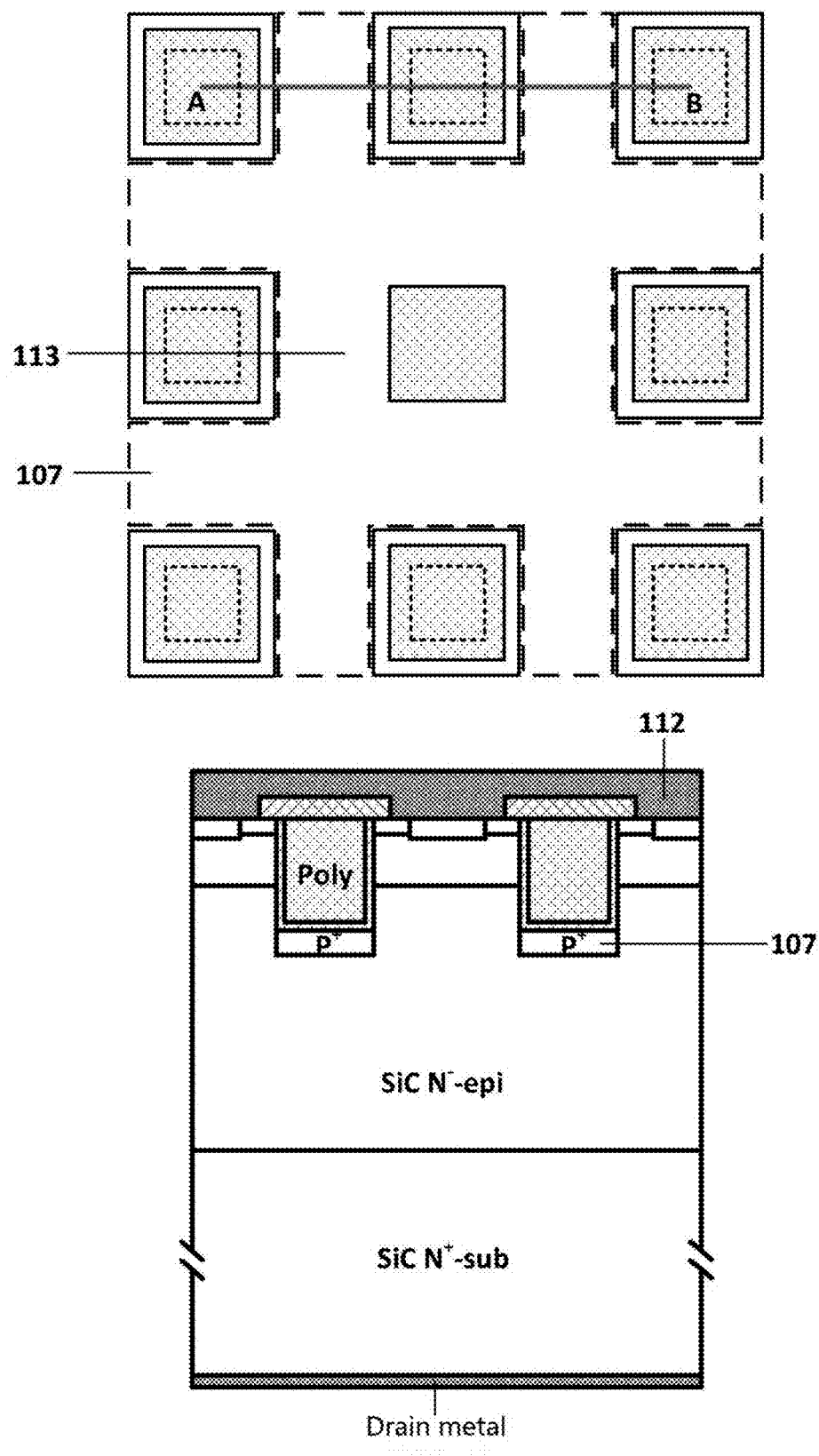
FIG. 1 shows a layout of a trench gate silicon carbide MOSFET device in the prior art and a schematic cross-sectional view of cells thereof along a line AB.
Figure 2:
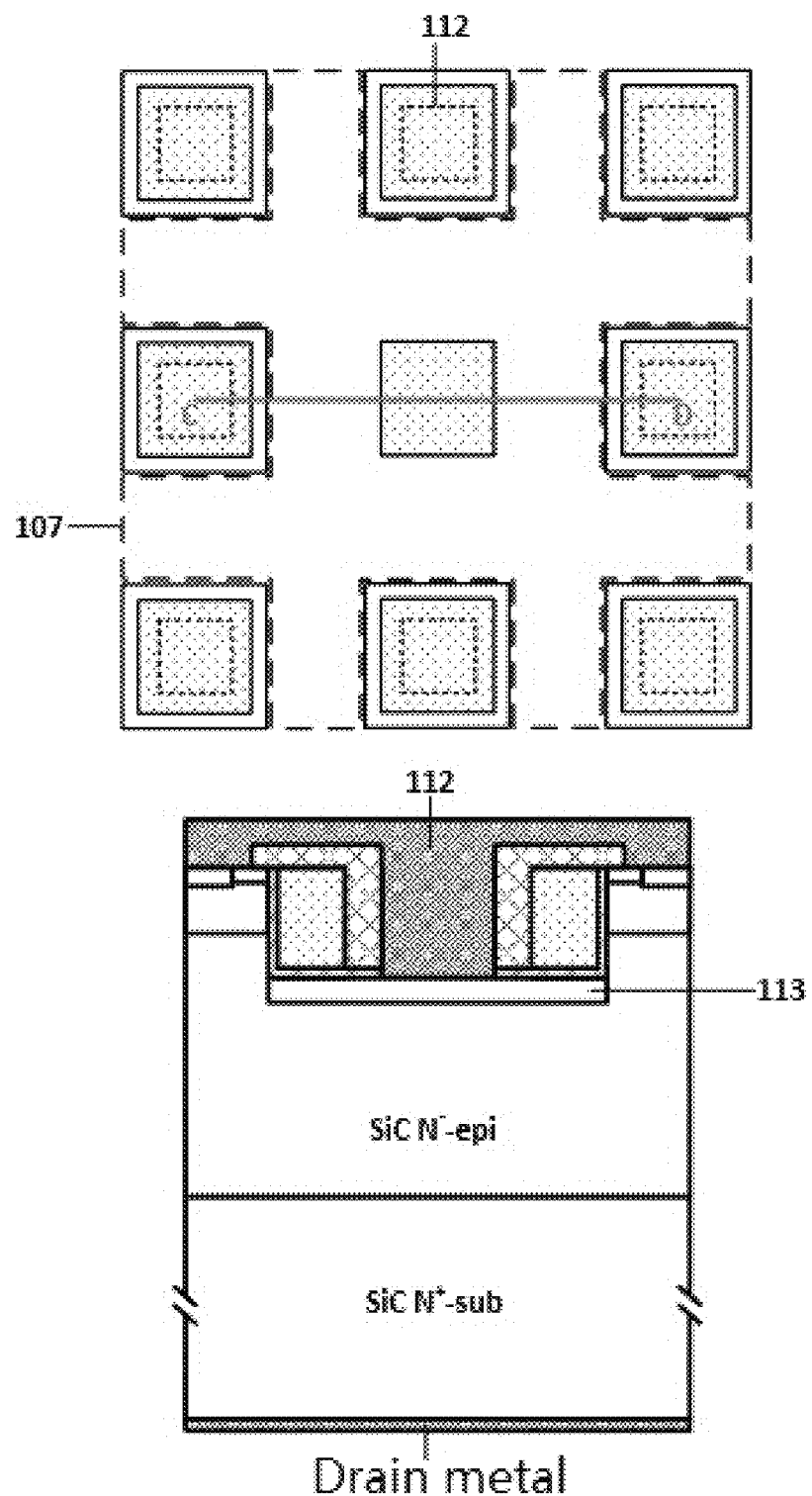
FIG. 2 shows a layout of a trench gate silicon carbide MOSFET device in the prior art and a schematic cross-sectional view of cells thereof along a line CD.
Figure 3:
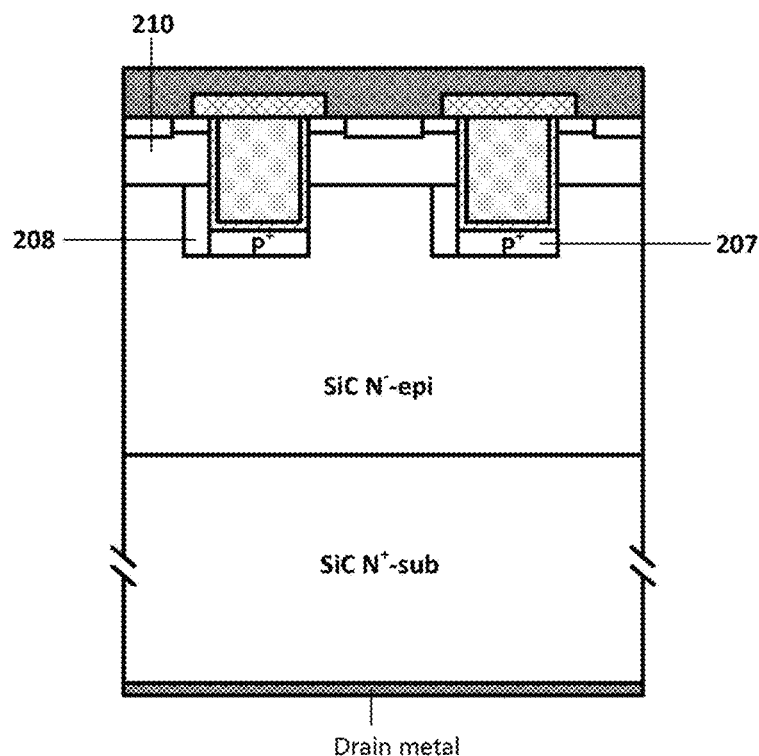
FIG. 3 is a schematic cross-sectional structural diagram of a trench gate silicon carbide MOSFET with tilted implantation on trench sidewalls in the prior art.

Compared with the prior art as shown in FIG. 3, the channel resistance of the present disclosure is reduced by 21% in the disclosure that the width of trench is 1 μm and the spacing between trenches is 2.5 μm (the prior art has the same size). The channel resistance can be further reduced if the cell pitch can be decreased.

Embodiment 2

Figure 14:
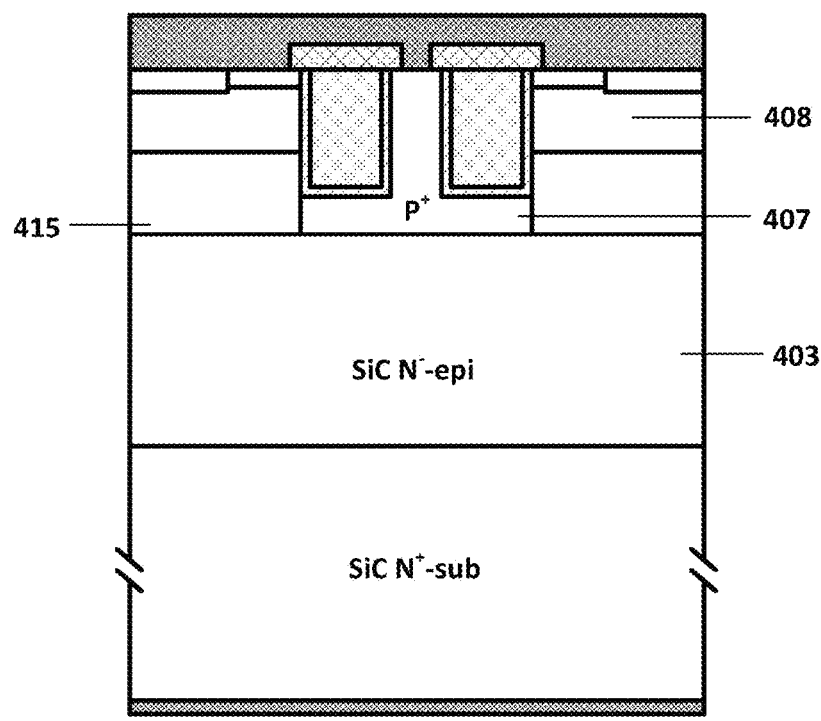
FIG. 14 is a schematic cross-sectional structural diagram of a π type trench gate silicon carbide MOSFET device according to the second embodiment of the present disclosure.

FIG. 14 is a schematic cross-sectional structural diagram of a π type trench gate silicon carbide MOSFET device according to a second embodiment of the present disclosure. Compared with the first embodiment of the present disclosure, the second embodiment has the following features: an N type current spreading layer 415 is designed below a P well region 408. The concentration of the N type current spreading layer 415 is higher than that of the N-epitaxial layer 403, but lower than that of the P+ deep well layer 407. The N type current spreading layer 415 is implemented to reduce the resistance formed between the lower boundary of a channel and the bottom of the P+ deep well layer 407.

The invention claimed is:

1. A method for fabricating a π type trench gate silicon carbide MOSFET device, comprising the following steps:
    step one: growing a first conductivity type of lightly doped epitaxial layer on a first conductivity type of heavily doped silicon carbide substrate;
    step two: forming a second conductivity type of heavily doped deep well region on an upper surface of the first conductivity type of lightly doped epitaxial layer by means of high-energy ion implantation;
    step three: forming a second conductivity type of well region, a second conductivity type of heavily doped contact region, and a first conductivity type of heavily doped source region on the upper surface of the epitaxial layer by means of selective ion implantation, and performing high-temperature annealing to activate impurities, wherein before the annealing process, a carbon film needs to be used to cover a surface of silicon carbide to prevent out-diffusion of the impurities and migration of silicon carbide atoms on the surface;

in the step three, a first conductivity type of current spreading layer is formed by means of selective ion implantation, wherein a doping concentration of the first conductivity type of current spreading layer is higher than a doping concentration of the first conductivity type of lightly doped epitaxial layer and lower than a doping concentration of the second conductivity type of heavily doped deep well region;

the second conductivity type of heavily doped deep well region is directly connected to the first conductivity type of heavily doped source region; and the depth of the second conductivity type of heavily doped deep well region exceeds the depth of the second conductivity type of well region;

step four: etching a first trench and a second trench spaced from each other in the second conductivity type of heavily doped deep well region by means of dry etching, wherein in the step four, the first trench and the second trench that are shallower than the second conductivity type of heavily doped deep well region are etched along a right sidewall and a left sidewall of the second conductivity type of heavily doped deep well region respectively, the first trench and the second trench form a first trench gate and a second trench gate respectively, and a distance between the first trench gate and the second trench gate is not greater than a width of a mesa between the first trench gate and a second trench gate;

step five: growing a gate oxide layer by means of dry-oxygen oxidation, and performing post-oxide annealing;

step six: depositing conductive dielectric layers and performing photoetching and etching;

step seven: depositing interlayer dielectric and performing photoetching and etching; and step eight: depositing an ohmic contact metal on a front surface, selectively removing the metal outside a contact hole, performing ohmic contact metal annealing, depositing a thick metal on the front surface, performing photoetching and etching, then depositing a passivation layer, performing photoetching and etching, and performing backside grinding, backside metal deposition, and annealing.

2. The method for fabricating a π type trench gate silicon carbide MOSFET device according to claim 1, wherein a doping impurity in the step one is nitrogen; and/or in the step two, an implanted ion is aluminum, and an implantation temperature is 500° C.; and/or in the step three, an annealing temperature is 1,600-1,800° C., and a carbon cap is used to cover the surface of the silicon carbide before the annealing process; and in the step six, deposition materials of the conductive dielectric layers are polysilicon layers or other metal silicide materials.

3. The method for fabricating a π type trench gate silicon carbide MOSFET device according to claim 1, wherein the interlayer dielectric layers are deposited above the conductive dielectric polysilicon layers and extend outwards separately to cover a part of the first conductivity type of heavily doped source region.

* * * * *